(12) United States Patent
Hartley

(10) Patent No.: US 6,291,819 B1
(45) Date of Patent: Sep. 18, 2001

(54) METHOD OF CALIBRATING AN ELECTRON BEAM SYSTEM FOR LITHOGRAPHY

(75) Inventor: John G. Hartley, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/393,095

(22) Filed: Sep. 9, 1999

(51) Int. Cl.[7] ................................................. H01J 37/304
(52) U.S. Cl. ........................ 250/252.1; 250/491.1; 250/492.2
(58) Field of Search ...................... 250/252.1, 491.1, 250/492.2

(56) References Cited

U.S. PATENT DOCUMENTS

| | | |
|---|---|---|
| 3,644,700 | 2/1972 | Kruppa et al. . |
| 3,874,916 | 4/1975 | Livesay et al. . |
| 4,390,788 | 6/1983 | Hayashi et al. . |
| 4,467,211 | 8/1984 | Smith et al. . |
| 4,728,799 | 3/1988 | Gordon et al. . |
| 4,737,646 | 4/1988 | King et al. . |
| 5,043,586 | * 8/1991 | Giuffre et al. ............... 250/252.1 |
| 5,301,124 | 4/1994 | Chan et al. . |
| 5,315,123 | 5/1994 | Itoh et al. . |

OTHER PUBLICATIONS

Raugh, "Error estimation for lattice methods of stage self–calibration," Mar. 1997, Proceedings of SPIE, vol. 3050, pp. 614–625.
Raugh, "Overlay Can Be Improved By Self–Calibrated XY Measuring Instrument: A Lattice Perspective," Sep. 1996, Proceedings of SPIE, vol. 2884, pp. 379–391.
Takac et al., "Obtaining a Physical Two–Dimensional Cartesian Reference," Nov./Dec. 1997, J. Vac. Sci. Technol., pp. 2173–2176.
Raugh et al., "Statistical Perspectives of Self–Calibration," Proceedings of SPIE, vol. 2725, pp. 114–121.

* cited by examiner

*Primary Examiner*—Kiet T. Nguyen
(74) *Attorney, Agent, or Firm*—Eric W. Petraske

(57) ABSTRACT

A method of calibrating an electron beam system in which a plurality of standard grids are mounted in various presentations in the electron beam system and treated as different presentations of the same grid for the purposes of applying algorithms to adjust a computer-controlled system for deflecting the electron beam. A standard grid mask is fabricated in an electron beam system and used in a stepper to make the standard grids, the same stepper and the same stepper optics being used to make each of the standard grids.

8 Claims, 3 Drawing Sheets

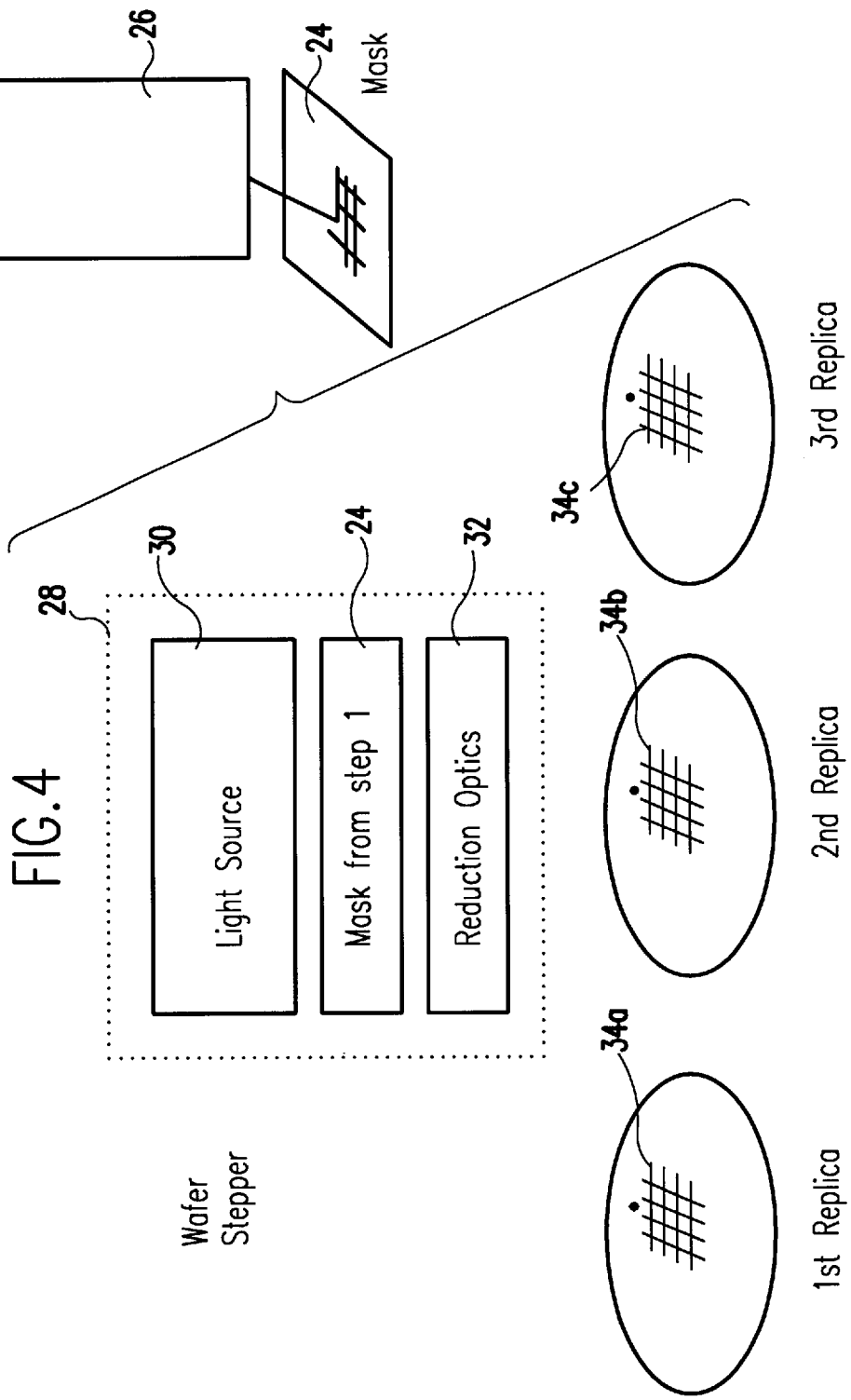

METHOD OF CALIBRATING AN ELECTRON BEAM SYSTEM FOR LITHOGRAPHY

BACKGROUND OF THE INVENTION

The present invention relates to a method of calibrating an electron beam system for lithography in making patterns on a semiconductor wafer or in making a mask therefor. More specifically, the invention relates to a method of calibrating the electron beam system by using a standard grid and thereby improving the accuracy of XY placement on a stage of the electron beam system.

Electron beam systems, or electron beam tools, are used in lithographic processes called electron beam lithography, or e-beam lithography, to make masks for producing patterns on semiconductor wafers or to produce patterns directly on semiconductor wafers. The electron beam of an electron beam system is electrically and magnetically deflected by a computer-controlled deflection system in a known manner whereby the electron beam writes a desired pattern on a substrate to produce the mask or writes a desired pattern directly on a semiconductor wafer. All electron beam systems have inherent errors. As a result, distortions are present in the pattern written by the electron beam unless the electron beam system is calibrated to correct for such errors.

A known method of calibrating an electron beam system uses a two-dimensional standard grid and an algorithm for adjusting the computer-controlled deflection system for deviations of the electron beam from the standard grid due to the errors inherent in the electron beam system. This known method is a self-calibration method, which involves the use of an imperfectly constructed measurement gauge, or standard, and an imperfectly calibrated measuring or manufacturing machine to calibrate each other. A number of algorithms exist for self-calibration of electron beam systems through the use of metrology standards, such as standard grids, in two dimensions. Such algorithms are described in, for example, *Statistical Perspectives of Self-Calibration,* Raugh, M. R. et al., Proceedings of SPIE, Vol. 2725, pp. 114–121, April 1996; *Error Estimation for Lattice Methods of Stage Self-Calibration,* Raugh, M. R., Proceedings of SPIE, Vol. 3050, pp. 614–625, 1997; *Overlay Can Be Improved by Self-Calibrated XY Measuring Instrument: A Lattice Perspective,* Raugh, M. R., Proceedings of SPIE, Vol. 2884, pp. 379–391, July 1996; and *Obtaining a Physical Two-Dimensional Cartesian Reference,* Takac, M. T. et al., Journal of Vacuum Science Technology, B 15(6), pp. 2173–2176, November/December 1997.

All metrology or calibration standards have their own built-in errors. These errors must be characterized so that their effects can be compensated in calibration methods. Typically, a two-dimensional grid is physically rotated so that errors due to its orthogonality and symmetry can be nulled. Thus, one requirement of all of the methods using metrology standards is that the standard to be calibrated, such as a standard grid, must be able to undergo both translation and rotation during the calibration process. However, standard grids for an electron beam system must be fixed inside the system, and the freedom to both translate and rotate the standard grid is not usually available due to, for example, mounting requirements. Furthermore, even when the freedom is available, a very precise mechanical function is required.

SUMMARY OF THE INVENTION

By the present invention, a method of calibrating an electron beam system is provided which does not require physical rotation or translation of a standard grid to various presentations in the system. Instead, the method of the present invention uses multiple copies of the same standard grid in the various presentations. The method of the present invention characterizes errors that are common to all copies of the standard grid, such as those induced by equipment, for example, an electron beam system, in making a standard grid mask and those induced from the subsequent manufacturing steps for making the copies of the standard grid. The method of the present invention does not characterize errors that are not common to the copies of the standard grids, such as those caused by variations in the manufacturing process from one standard copy grid to the next. It assumes those errors are small compared to the errors that are common to all copies of the standard grid, which is typically true.

The method of the present invention makes use of a standard grid mask fabricated on an electron beam lithography system or tool to make a set of standard grids, standard grid copies that all share the same errors to a high degree of accuracy. The steps of the method include fabricating the standard grid mask using the electron beam lithography system, and then using the standard grid mask in a conventional manner, such as in a conventional stepper, to make standard grids. The same stepper and the same subset of stepper optics are used for making each standard grid, so that a set of standard grids is obtained in which each standard grid contains identical mask and stepper errors. In order to calibrate an electron beam system, several of the identical standard grids are installed in the electron beam system in different presentations and are treated as different presentations of the same grid for the purposes of applying known algorithms, such as those described in the publications mentioned earlier herein.

BRIEF DESCRIPTION OF THE DRAWINGS

FIG. 3 is a schematic view of a mask exposure tool producing a standard grid mask in accordance with the present invention;

FIG. 4 is a schematic illustration of a wafer stepper producing three standard grids from the standard grid mask produced in FIG. 3;

DETAILED DESCRIPTION OF THE PREFERRED EMBODIMENT

Figure 1:
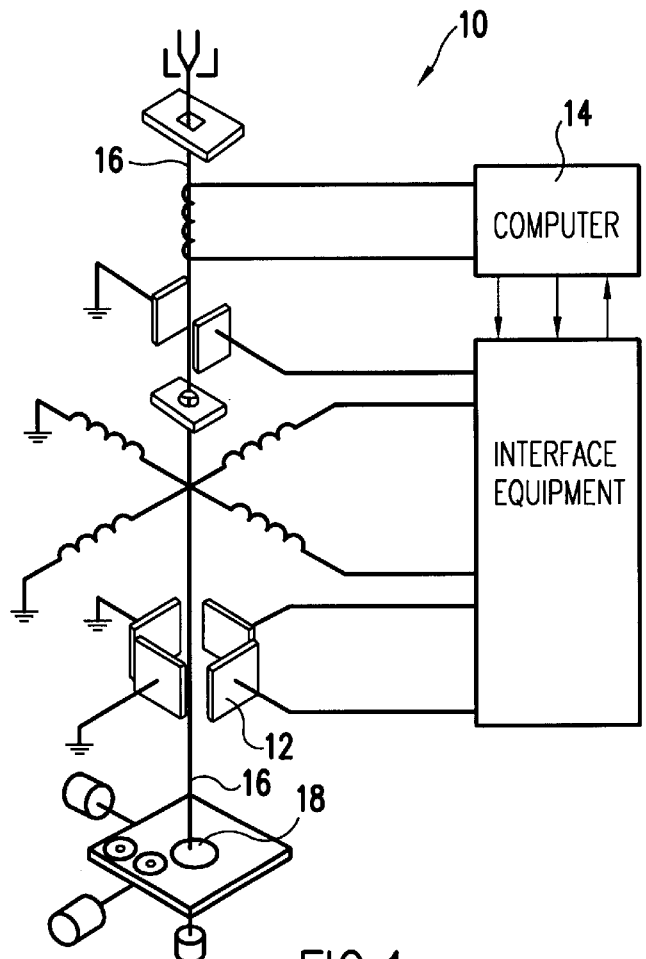
FIG. 1 is a schematic illustration of an electron beam system, which is calibrated according to the present invention and which can be used to make a standard grid mask according to the present invention.

The present invention relates to a method for calibrating a system or tool that employs a stream of charged particles to impinge upon a resist material on a substrate in predetermined patterns to produce masks for use in the fabrication of semiconductor devices. Such systems or tools can also be used in connection with a resist material on a semiconductor substrate to form desired patterns directly on the semiconductor substrate. The systems or tools are usually electron beam systems or tools or, more simply, e-beam systems or tools, such as the electron beam system 10 of FIG. 1, which employs deflection plates 12 controlled by a computer 14 to write with a stream or beam 16 of electrons on a substrate 18.

Figure 2:
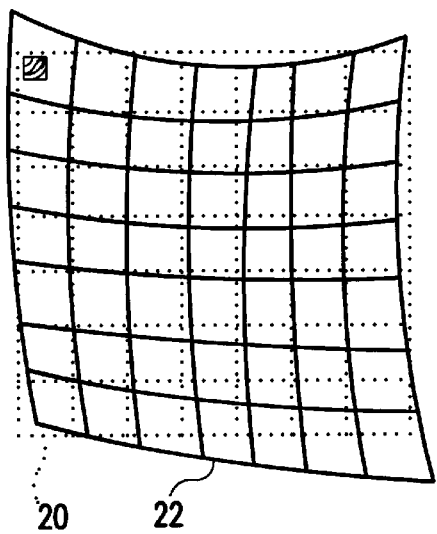
FIG. 2 is a schematic illustration of a distorted grid produced by an electron beam system before calibration.

FIG. 2 illustrates in dotted lines a grid pattern 20 which the electron beam 16 is controlled by the computer 14 to write on a substrate. However, due to errors inherent in the electron beam system 10, deflection distortions cause the grid actually written by the electron beam 16 on the substrate 18 to be distorted, resembling for example the distorted grid 22 shown in solid lines.

In order to calibrate the electron beam system 10 and, thereby, eliminate the distortions in patterns written by the electron beam 16, including integrated circuitry patterns, the method of the present invention involves making a standard grid mask 24 in a mask exposure tool 26, as can be seen in FIG. 3. The mask exposure tool 26 can be an electron beam system. The mask exposure tool 26 can be, but is not required to be, the electron beam system that is to be calibrated. The production of masks using electron beam systems is well known.

As can be seen from FIG. 4, the standard grid mask 24 produced by the mask exposure tool 26 in FIG. 3 is inserted in a wafer stepper 28, which can be of conventional design. Such a wafer stepper 28 includes a light source 30 and reduction optics 32, which can produce a standard grid 34a which is a replica or copy of the standard grid mask 24 on a substrate on a smaller scale than the standard grid mask. In accordance with the present invention, a plurality of identical standard grids 34a, 34b and 34c are produced, using the same standard grid mask 24, the same wafer stepper 28, and the same optics 32. In a preferred embodiment, three identical standard grids are made.

Figure 5:
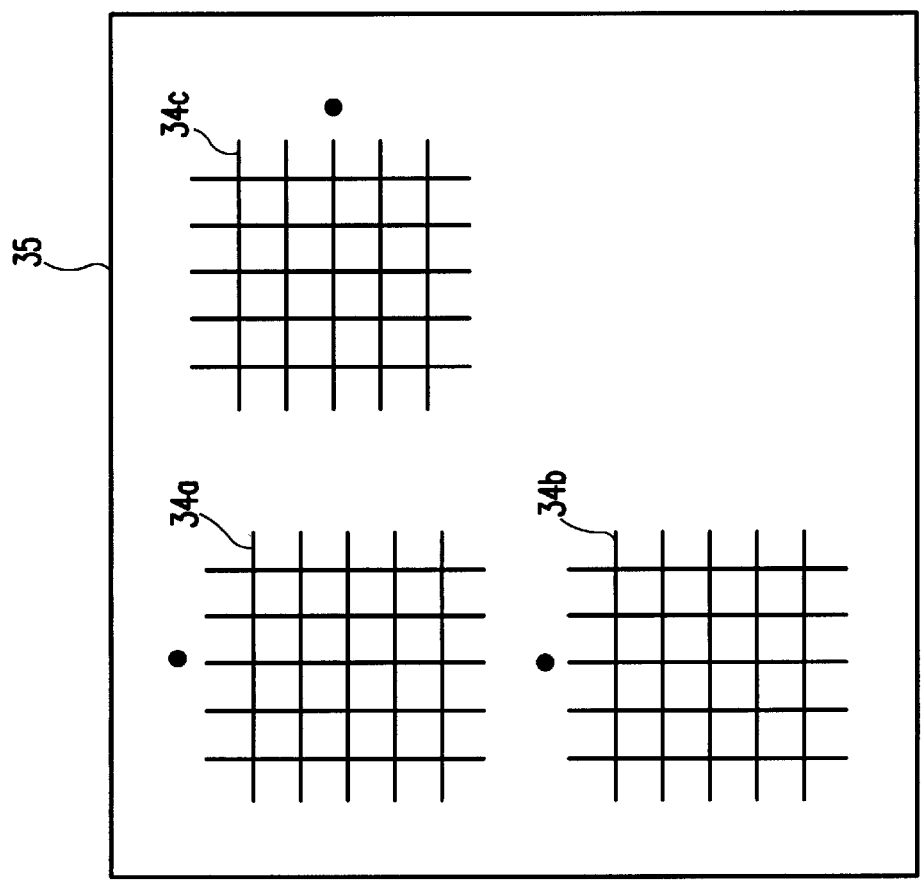
FIG. 5 is a schematic illustration of the orientations of the three standard grids of FIG. 4 mounted on the stage of an electron beam system being calibrated in accordance with the present invention.

As can be appreciated from FIG. 5, the three standard grids 34a, 34b and 34c are positioned in three presentations on a block 35 mounted on the mechanical stage of an electron beam system to be calibrated. The "presentation" of a standard grid includes both its translational position and its rotational orientation. A first standard grid 34a is presented in a reference presentation. A second standard grid 34b is presented adjacent to the first standard grid 34a, translated relative to the first standard grid but not rotated relative thereto. The third standard grid 34c is positioned adjacent to the first standard grid 34a, translated relative to the first standard grid and rotated 90° relative thereto. The arrangement shown in FIG. 5 has an "L" shape, but other arrangements can be used.

Figure 6:
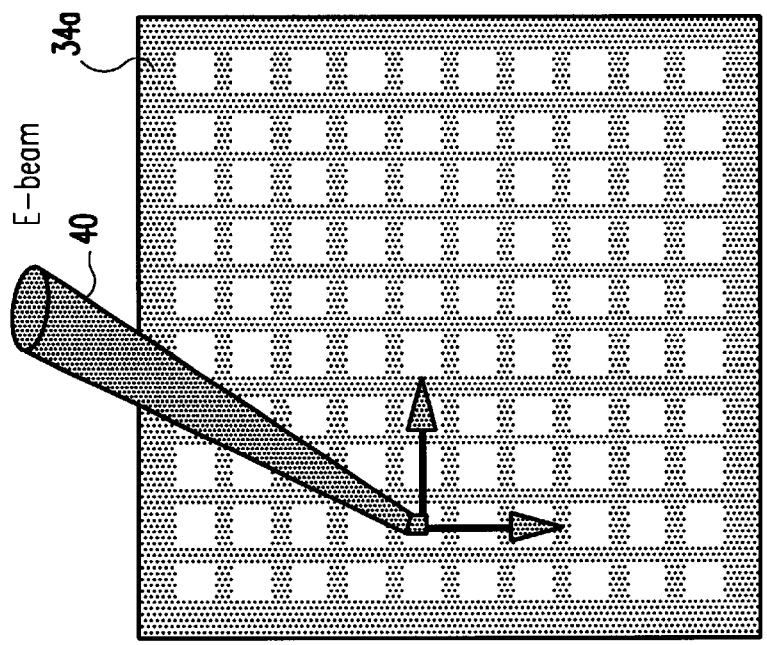
FIG. 6 is a schematic illustration of the scanning of a standard grid with the electron beam of a system being calibrated.

As can be appreciated from FIG. 6, each of the presentations of the standard grid, that is, each of the standard grids 34a, 34b and 34c, is scanned with an electron beam 40 of the electron beam system to be calibrated, using a computer-controlled deflection system. In a method known in the art, the impingement of the electron beam 40 on the substrate containing the standard grid produces a backscatter of electrons. The backscatter varies in a known manner depending upon the incidence of the electron beam on, or the deviation of the electron beam, from the lines of the standard grid. In the method of the present invention, the electron beam 40 scans back and forth horizontally in a raster fashion for the entire height of each of the standard grids 34a–34c to detect the positions of each of the vertical lines, and the electron beam scans up and down vertically across the entire width of each of the standard grids 34a–34c to detect the positions of each of the horizontal lines. The standard grids 34a–34c are scanned one at a time. The signal produced by the backscatter is received and analyzed by the computer that controls the deflecting system. The corrections needed in the computer control of the electron beam 40 to eliminate the deflection distortions are calculated using known algorithms, and the corrections are applied to the deflection program in the computer. As a result, the electron beam system is calibrated, and the corrected computer control causes the electron beam 40 to write a desired undistorted pattern on a substrate.

Appropriate algorithms include those specifically referred to earlier herein. At least one such algorithm is designed to be used with three presentations of a standard grid in which there is a reference presentation, a second presentation translated but not rotated relative to the reference presentation, and a presentation translated and rotated 90° relative to the reference presentation.

It will be apparent to those skilled in the art and it is contemplated that variations and/or changes in the embodiments illustrated and described herein may be made without departure from the present invention. Accordingly, it is intended that the foregoing description is illustrative only, not limiting, and that the true spirit and scope of the present invention will be determined by the appended claims.

What is claimed is:

1. A method of calibrating a system employing a beam of charged particles for use in lithography, wherein the system includes an arrangement for deflecting the beam of charged particles, comprising:
   making a set of substantially identical standard grids, wherein each grid has a plurality of lines;
   placing the standard grids in different presentations in the system;
   scanning the standard grids with the beam of charged particles to produce a backscatter of charged particles;
   detecting from the backscatter of the charged particles positions of the lines of the standard grids; and
   adjusting the beam deflecting arrangement in accordance with the detected positions of the lines of the standard grids.

2. The method of claim 1, further comprising making a standard grid mask, wherein the step of making a set of substantially identical standard grids comprising employing the standard grid mask in a stepper to make the set of standard grids.

3. The method of claim 2, wherein stepper optics are used in the stepper to make the set of standard grids, and each of the standard grids of the set is made using the same stepper optics, whereby all of the standard grids of the set contain identical mask and stepper errors.

4. The method of claim 1, wherein three standard grids are placed in the system, a first of the standard grids being placed in a first presentation, a second of the standard grids being placed in a second position translated but not rotated relative to the first presentation, and the third of the standard grids being placed in a third presentation translated and rotated relative to the first and second presentations.

5. The method of claim 4, wherein the third of the standard grids is rotated 90° relative to the first and second standard grids.

6. The method of claim 5, wherein the step of adjusting the beam deflecting arrangement comprises applying an algorithm to the detected positions of the lines of the standard grids, and the step of adjusting the beam deflecting arrangement comprises adjusting the beam deflecting arrangement in accordance with the applied algorithm.

7. The method of claim 1, wherein the step of adjusting the beam deflecting arrangement comprises applying an algorithm to the detected positions of the lines of the standard grids, and the step of adjusting the beam deflecting arrangement comprises adjusting the beam deflecting arrangement in accordance with the applied algorithm.

8. The method of claim 1, wherein the beam of charged particles is an electron beam.

* * * * *